(12) United States Patent
Spalding, Jr.

(10) Patent No.: US 9,081,038 B2
(45) Date of Patent: Jul. 14, 2015

(54) VOLTAGE MONITOR

(75) Inventor: George Redfield Spalding, Jr., Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 203 days.

(21) Appl. No.: 13/252,870

(22) Filed: Oct. 4, 2011

(65) Prior Publication Data

US 2013/0082684 A1    Apr. 4, 2013

(51) Int. Cl.
*G01R 1/00* (2006.01)
*G01R 15/06* (2006.01)
*H03F 3/45* (2006.01)
*G01R 19/00* (2006.01)
*G01R 19/25* (2006.01)

(52) U.S. Cl.
CPC ............ *G01R 15/06* (2013.01); *H03F 3/45475* (2013.01); *G01R 19/0038* (2013.01); *G01R 19/2506* (2013.01); *H03F 2203/45536* (2013.01); *H03F 2203/45544* (2013.01); *H03F 2203/45548* (2013.01); *H03F 2203/45594* (2013.01); *H03F 2203/45604* (2013.01); *H03F 2203/45616* (2013.01)

(58) Field of Classification Search
CPC ............................ G01R 15/06; H03F 3/45475
USPC ........... 324/111, 76, 112, 120, 76.11; 341/33, 341/150, 172
See application file for complete search history.

(56) References Cited

U.S. PATENT DOCUMENTS

| | | | | |
|---|---|---|---|---|
| 4,517,549 | A | 5/1985 | Tsukakoshi | 340/347 |
| 4,922,252 | A * | 5/1990 | Draxelmayr et al. | 341/172 |
| 5,852,415 | A | 12/1998 | Cotter et al. | 341/120 |
| 6,476,751 | B1 * | 11/2002 | Krymski et al. | 341/155 |
| 6,518,814 | B1 | 2/2003 | Majid et al. | 327/306 |
| 7,023,372 | B1 | 4/2006 | Singh et al. | 341/155 |
| 7,030,801 | B2 * | 4/2006 | Luo | 341/155 |
| 7,405,659 | B1 | 7/2008 | Hyde | 340/572.4 |
| 7,786,908 | B2 * | 8/2010 | Yoshinaga | 341/118 |
| 2004/0246153 | A1 | 12/2004 | Leung et al. | 341/120 |
| 2005/0151680 | A1 | 7/2005 | Kearney | 341/172 |
| 2007/0115159 | A1 | 5/2007 | Tachibana et al. | 341/144 |
| 2009/0072869 | A1 * | 3/2009 | Hsu et al. | 327/95 |
| 2010/0309035 | A1 * | 12/2010 | Yue et al. | 341/141 |
| 2011/0050634 | A1 * | 3/2011 | Lin et al. | 345/174 |
| 2011/0102228 | A1 | 5/2011 | Anthony et al. | 341/155 |
| 2011/0133963 | A1 * | 6/2011 | Kawai | 341/110 |

FOREIGN PATENT DOCUMENTS

WO    WO-2013052242 A1    4/2013

OTHER PUBLICATIONS

PCT Notification of the International Search Report and the Written Opinion of the International Searching Authority, Dated Dec. 12, 2012: for International Application No. PCT/US2012/054610.

\* cited by examiner

*Primary Examiner* — Tung X Nguyen
*Assistant Examiner* — Giovanni Astacio-Oquendo
(74) *Attorney, Agent, or Firm* — Schwegman Lundberg & Woessner, P.A.

(57) ABSTRACT

A voltage monitor comprising a first capacitive potential divider for presenting an attenuated representation of an input voltage to a comparator.

19 Claims, 8 Drawing Sheets

VOLTAGE MONITOR

FIELD OF THE INVENTION

The present invention relates to a voltage monitor having reduced power consumption.

BACKGROUND OF THE INVENTION

It is known that it is desirable to monitor a voltage occurring in an electronic circuit. This is often done so that protective or corrective measures may be taken if a voltage moves outside of an acceptable voltage range. However such monitoring circuits can be relatively power hungry as they may often be on permanently, and this can seriously impact on the power budget of power constrained devices, such as portable battery powered devices.

SUMMARY OF THE INVENTION

According to a first aspect of the present invention there is provided a voltage monitor comprising a capacitive potential divider for presenting an attenuated representation of an input voltage to a comparator.

The inventor has realised that with the use of a capacitive divider it is possible to eliminate the continuous current flow that occurs when implementing a resistor based potential divider.

Advantageously the voltage monitor further comprises a sampling arrangement to sample and hold a reference voltage from a reference voltage generator and present the reference voltage to the comparator. The use of a sample and hold arrangement allows the reference voltage generator to be switched off for extended periods of time, and only switched on momentarily in order to refresh the reference voltage. This further reduces the power consumption of the voltage monitor.

Advantageously the sampling capacitor is further associated with another capacitor such that an attenuated version of the reference voltage can be provided to the comparator.

Advantageously one, and preferably both of the capacitors of the capacitive potential divider are variable capacitors. Advantageously at least one of the sampling capacitor and the further capacitor is a variable capacitor. Such an arrangement allows the input voltage, the reference voltage or both to be selectively scaled before presentation to the comparator. This in turn means that the comparator can be designed to give its best comparative performance over a relatively small and well defined range of input voltages. This allows the comparator to be optimised for operation in this range, thereby simplifying its design and/or reducing its current requirements or voltage headroom requirements.

Advantageously switches are provided for selectively connecting or disconnecting the capacitive potential divider from an input voltage and from a further reference voltage. Typically, though not necessarily, the further reference voltage is a local ground. Such a local ground may be defined by one terminal of battery. Advantageously shorting switches are provided in association with the capacitors of the first capacitive potential divider such that the charge on each of the capacitors can be reset to a known initial value. Advantageously during the capacitor reset, the voltage on each plate of the capacitor is the same, and preferably is set to the reference voltage.

Where continuous voltage monitoring is required the voltage monitor may comprise first and second channels which may be operated in an alternating manner such that one channel may be monitoring the input voltage whilst the other channel is being refreshed, and visa-versa.

According to a second aspect of the present invention there is provided a voltage monitor comprising a sampling capacitor arranged to sample and hold a reference voltage and to present the reference voltage to a reference voltage input of a comparator.

BRIEF DESCRIPTION OF THE FIGURES

The present invention will be described, by way of non-limiting example, with reference to the accompanying Figures, in which.

DESCRIPTION OF EMBODIMENTS OF THE INVENTION

Figure 9:
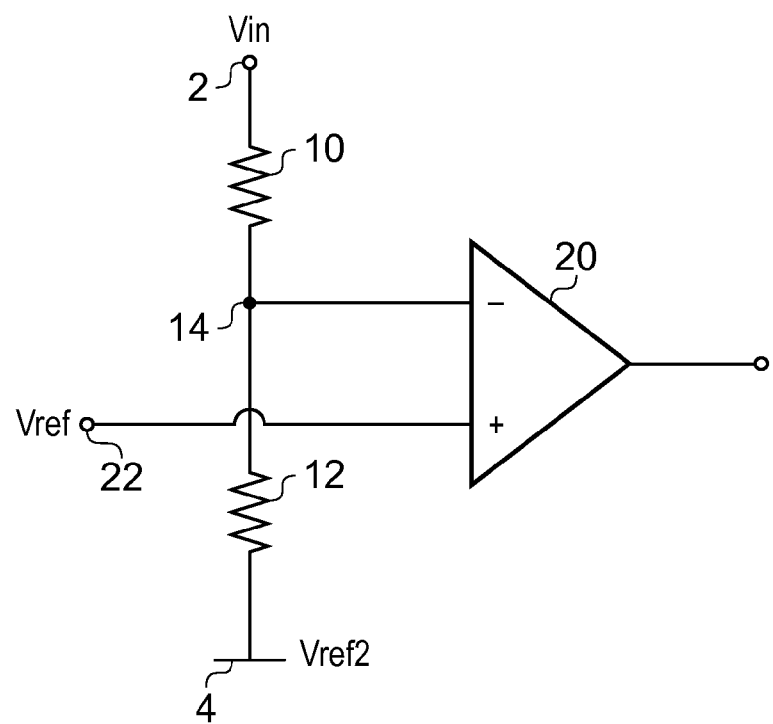
FIG. 9 is a circuit diagram of a prior art always on voltage monitor.

FIG. 9 is a circuit diagram of a prior art voltage monitor. In such an arrangement, first and second resistors 10 and 12 are connected in series between an input node 2 to which an input voltage Vin is supplied and a further node 4 which is held at a reference voltage, Vref2, which is typically, but not necessarily a local ground voltage, and hence can be regarded as being at zero volts. The resistors 10 and 12 have respective values R1 and R2 such that the voltage Vout occurring at an output node 14 between the resistors is given by $$Vout = Vin \cdot \frac{R2}{R1 + R2}$$

Typically a first input, such as an inverting input, of a comparator 20 is connected to the node 14. A voltage reference 22 is connected to a second input, typically a non-inverting input, of the comparator 20. In use, the comparator acts to compare the voltage at its first and second inputs and gives an output indicative of which one has the higher voltage.

Whilst such a circuit works well, it has several disadvantages. Firstly a current always passes through resistors 10 and 12 and consequently this constitutes a drain on the power supply of a device incorporating the voltage monitor. It should be noted that the input voltage is frequently attenuated, especially where it is the power supply voltage that is being monitored, in order that the voltages presented at the inputs of the comparator 20 lie between the supply voltages to the comparator such that the transistors within the comparator have sufficient headroom to operate correctly. Similarly, the voltage reference 22 is always on, and this constitutes a further drain on the power supply.

Figure 1:
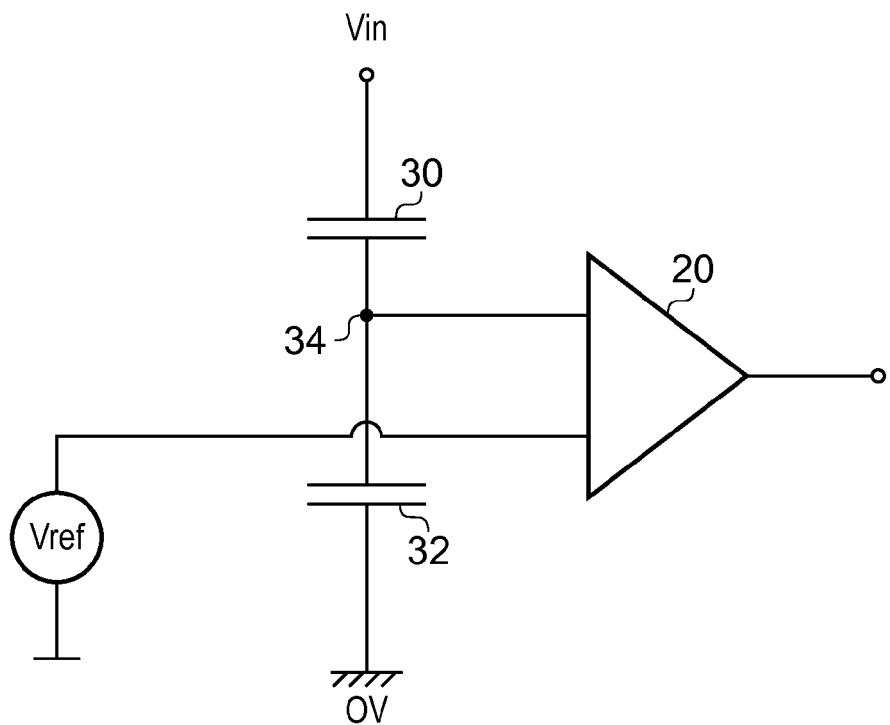
FIG. 1 schematically illustrates a voltage monitor having a capacitor based potential divider and constituting a first embodiment of the present invention.

FIG. 1 is a schematic diagram showing a first embodiment of the present invention. The first and second resistors 10 and 12 of FIG. 9 have now been replaced with first and second capacitors, 30 and 32 respectively so as to form a capacitive potential divider. As is known to the person skilled in the art, if both the capacitors start in an initially uncharged state, then when the input voltage Vin is applied the voltage at an intermediate node 34 will track the input voltage, subject to being divided down by the ratio of the capacitances of the first and second capacitors 30 and 32. Thus if the first capacitor 30 has a capacitance C1, and the second capacitor 32 has a capacitance C2, then the voltage Vout at node 34 is given by:

$$Vout = Vin \frac{C1}{C1 + C2}$$

This voltage can then be supplied to a comparator 20 having zero or substantially zero input current. Fortunately such comparator input stages can be implemented using field effect transistors. The arrangement shown in FIG. 1 allows for the elimination of the continuous waste of current through the resistive potential divider shown in FIG. 9.

Figure 2:
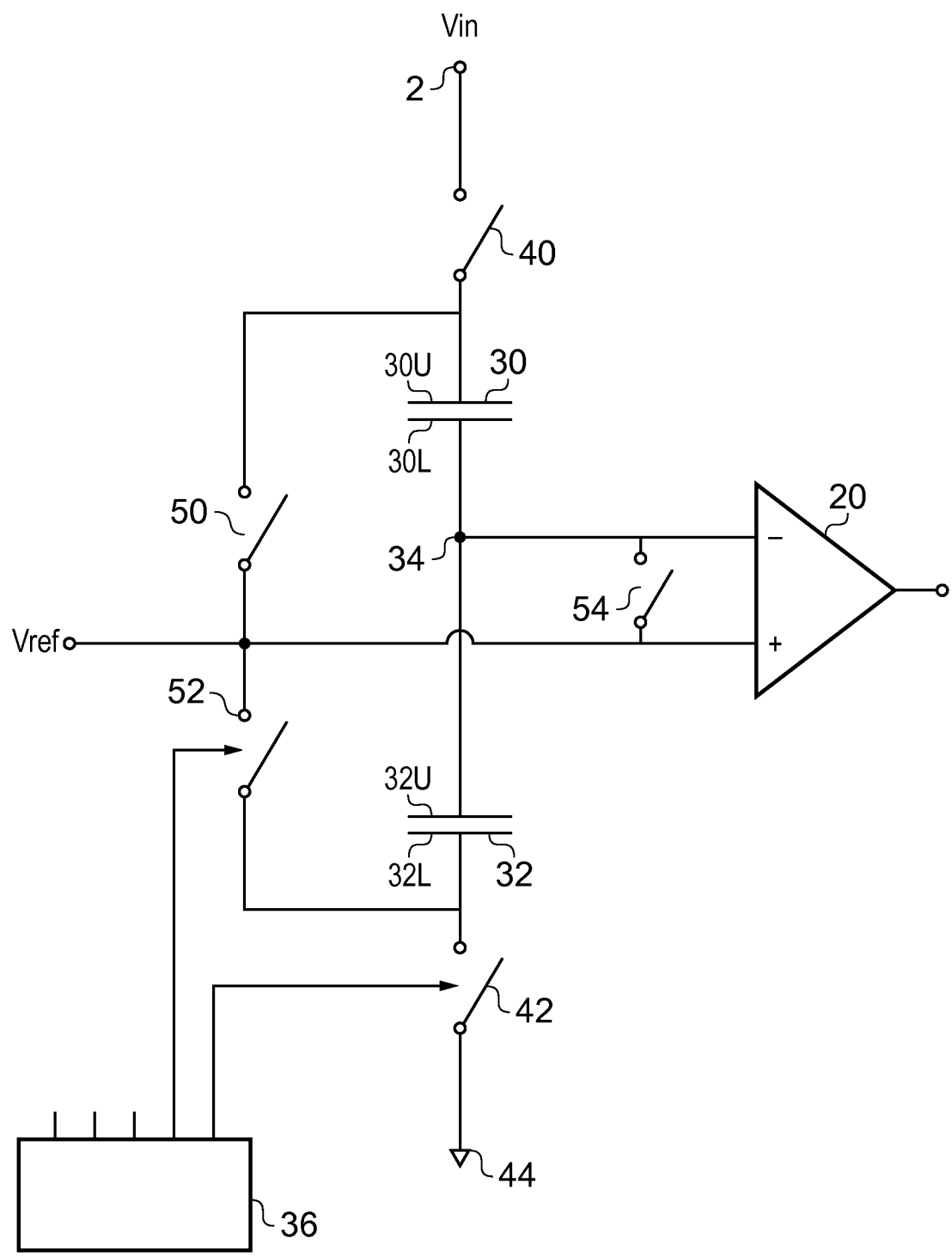
FIG. 2 is a circuit diagram showing the provision of reset switches in association with the capacitors of the potential divider such that the circuit of FIG. 1 can be reset to an initial condition.

As noted before, the capacitive divider needs to be set to initial conditions in order to operate reliably. FIG. 2 is a circuit diagram showing modifications to the arrangement of FIG. 1 in order to allow initial conditions to be set. Like reference numerals are used to identify like parts. In order to achieve setting of initial conditions electrically controllable switches are provided in association with the capacitors. The electrically controllable switches are implemented as field effect transistors as is known to the person skilled in the art. However because the transistors are driven in a digital mode, so as to be either high impedance or low impedance, it is convenient to draw them as switches controlled in response to signals provided by a switch controller 36. For clarity, only the control signals to some of the switches have been drawn, although it is to be understood that the switch controller is connected to a controlling terminal (gate terminal) of each of the transistors acting as the electrically controlled switches.

A first switch 40 is provided between the input node 2 and a first plate of the first capacitor 30 (shown as the uppermost plate in FIG. 2). Similarly a second switch 42 is provided between the second capacitor 32 and the local ground 44. In the arrangement shown in FIG. 2 a lower plate 30L of the first capacitor 30 is connected to an upper plate 32U of the second capacitor 32 and an output node 34; and a lower plate 32L of the second capacitor 32 is connected to the second switch 42. A third switch 50 is arranged to selectively connect an upper plate 30U of the first capacitor 30 to the reference voltage Vref. Similarly a fourth switch 52 is arranged to connect the lower plate 32L of the second capacitor 32 to the reference voltage Vref. The upper plates of each capacitor may be regarded as being "first" plates and the lower plates may be regarded as being "lower" plates. A fifth switch 54 is arranged to selectively connect the node 34 and hence the lower (second) plate 30L of the first capacitor 30 and the top (first) plate 32U of the second capacitor 32 to Vref.

In order to initially set the capacitive divider to an operative state, the first and second switches 40 and 42 are opened (placed in a high impedance state) and then the third, fourth and fifth switches 50, 52 and 54 are closed (placed in a low impedance state) such that each plate of the first and second capacitors 30 and 32 is connected to Vref. Consequently the capacitors are set to an initial uncharged condition in which there is no voltage difference across either of the capacitors.

When it is desired to use the circuit the third, fourth and fifth switches 50, 52 and 54 are opened so as to isolate the capacitors from the reference voltage. Then the first and second switches 40 and 42 are closed thereby causing an attenuated version of the voltage Vin to be presented to one of the comparator inputs, in this case the inverting input.

The first to fifth switches are not ideal components and each can be expected to exhibit a small leakage current which will eventually accumulate on the first and second capacitors 30 and 32, in ratios which are unknown, and thereby perturb the operation of the voltage monitor. Therefore the voltage monitor cannot reliably be operated continuously and must be occasionally refreshed by resetting it to its initial condition.

Operation of the first to fifth switches may also cause unwanted charge injection to occur into the capacitive potential divider. However by keeping the switches similar, in that the first and second switches 40 and 42 are of a similar size to each other, and the third and fourth switches 50 and 52 are of a similar size to each other, then the symmetric nature of the circuit means that to a first order approximation such charge injection resulting from operation of the switches cancels out.

Figure 3:
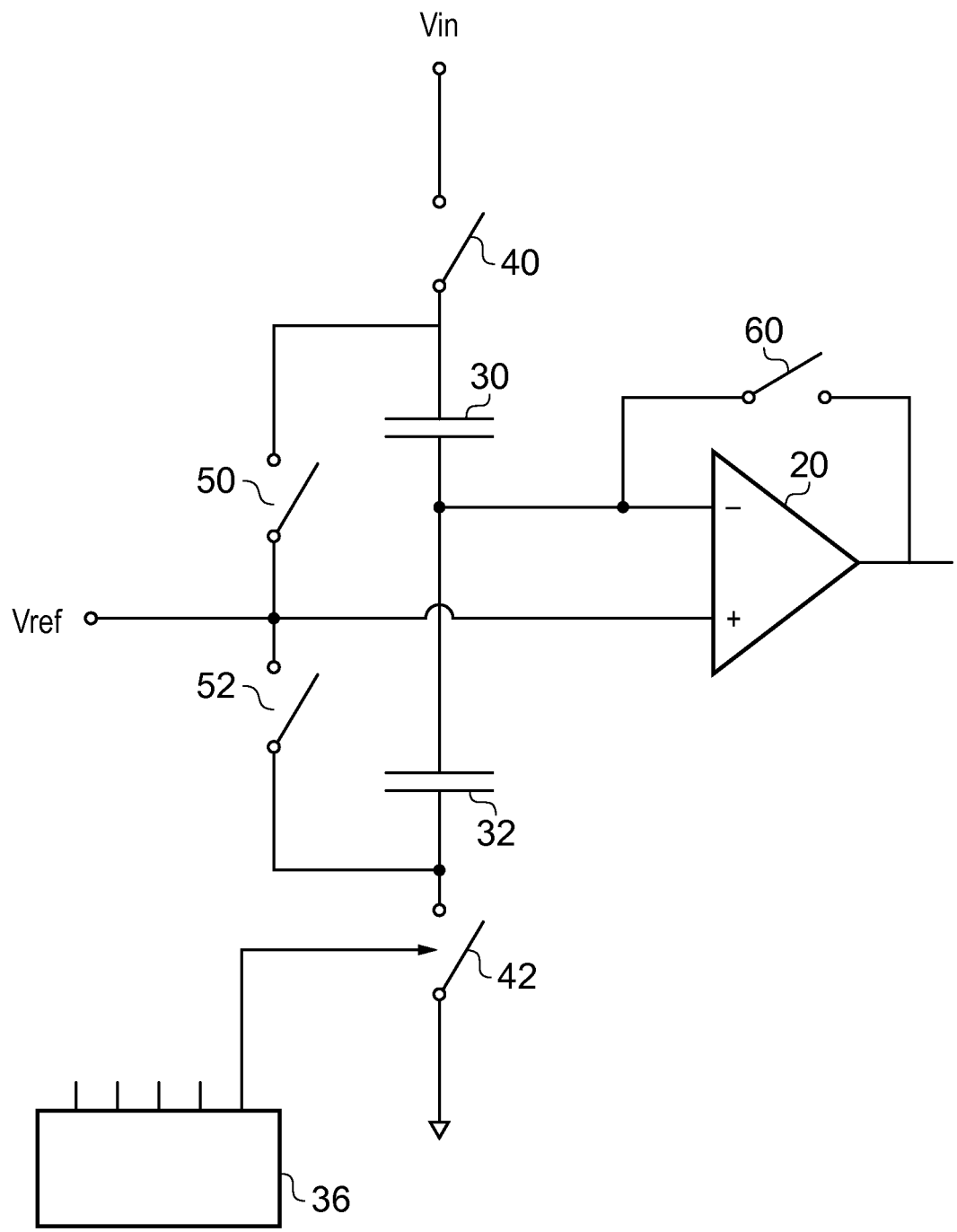
FIG. 3 is a circuit diagram showing a modification of the arrangement shown in FIG. 2 and constituting a further embodiment of the present invention.

Although the arrangement shown in FIG. 2 works well to reset the capacitors to an initial state, it does not address potential offsets within the comparator 20. The comparator offsets can be notionally reflected back through the comparator to the signals presented to its input and can be regarded as perturbation voltages added to the voltages across the capacitors of the capacitive potential divider. However, with a small modification as shown in FIG. 3 in which the fifth switch 54 is removed such that it can no longer selectively connect the node 34 to the voltage reference, and is replaced by a sixth switch 60 operable to connect an output of the comparator 20 to its non-inverting input, then it can be seen that the comparator can be forced to act as a unity gain buffer. Consequently, if the comparator 20 was an ideal component having no offsets it would force the voltage at its output, and consequently at its inverting input, to match the reference voltage and hence the plates of each of the first and second capacitors 30 and 32 would still be held at exactly the same potential thereby mimicking the situation described with respect to FIG. 2. However if the comparator 20 exhibits an input offset, then this is sampled onto the first and second capacitors 30 and 32 resulting in the input offset being nulled out when the circuit is released from its reset configuration and used as a voltage monitor.

Figure 4:
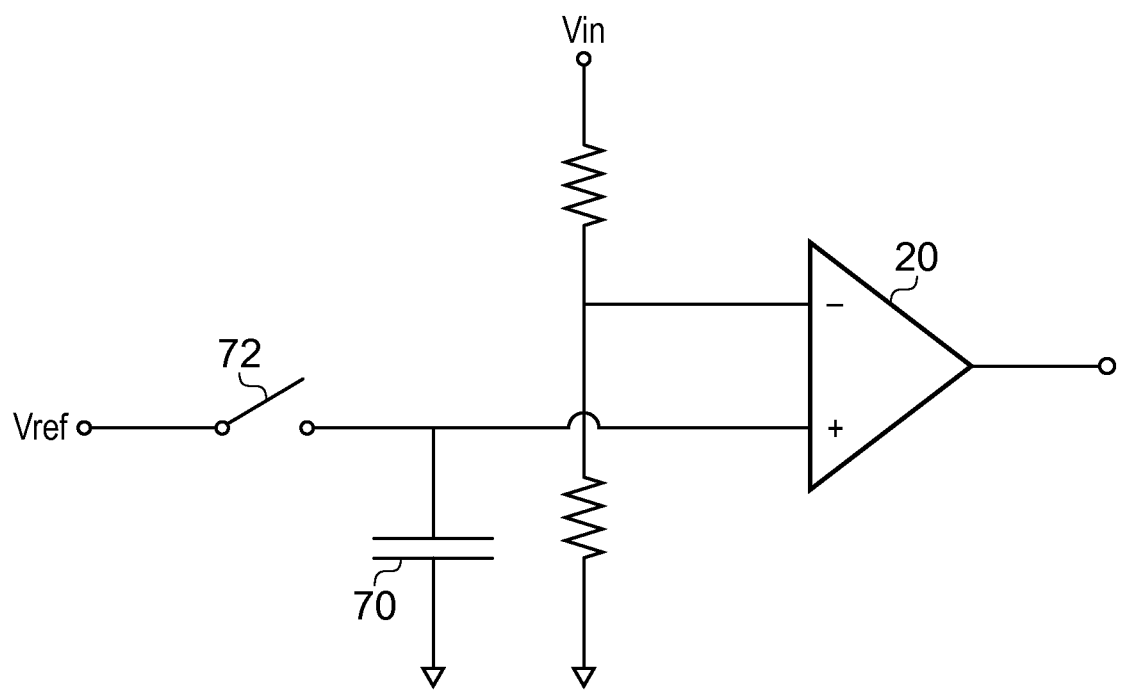
FIG. 4 schematically illustrates a sample and hold circuit adapted to sample and hold a voltage reference and constituting a further embodiment of the present invention.

FIG. 4 is a circuit diagram schematically illustrating a further embodiment of the present invention in which the problems of having to continuously power the voltage reference are addressed. This embodiment could be used, either with a resistive potential divider as shown in FIG. 4, or more preferably with a capacitive potential divider as described with respect to FIGS. 1 to 3, and as will be explicitly shown in FIG. 6.

If the voltage reference has a suitable value such that there is no need to rescale it to a different value, then the circuit shown in FIG. 4 can be used to allow the voltage reference generator to be de-powered most of the time and periodically re-powered to enable the voltage produced by the voltage reference generator to be stored on a sampling capacitor 70. The sampling capacitor is connected between reference voltage input of the comparator (in this example the non-inverting input) and ground. An electrically controllable switch 72 is interposed in the signal path from the voltage reference generator to the comparator 20 and the sampling capacitor 70 such that the connection to the voltage reference can be selectively made high impedance during those periods when the voltage reference generator is de-powered, and when the voltage reference has been re-powered and is stable, then the switch 72 can be made low impendence in order to allow the voltage sampled onto the sampling capacitor to be corrected to match the reference voltage. The voltage reference generator generally has a low impedance and can reliably be used to charge the capacitor 70 to the reference voltage even if the capacitor has a relatively large value. Furthermore, because the leakage current at the reference input of the comparator is generally very small, this means that the rate of change of the voltage at the reference input is relatively slow. As a consequence, the voltage reference generator can be turned off for most of the time, or put another way, it can have a duty cycle of around 1% or less. This represents approximately a 100 fold saving of the current drawn by the voltage reference generator compared to having it permanently on.

Figure 5:
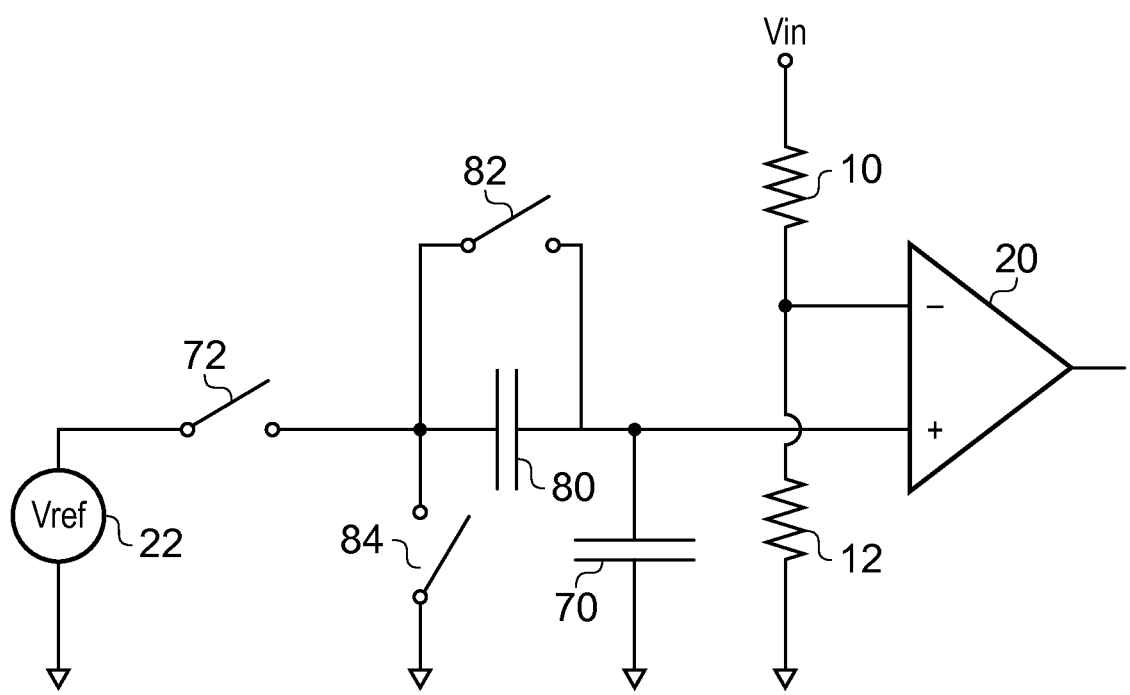
FIG. 5 is a circuit diagram of a further sample and hold arrangement in conjunction with a voltage monitor.

If, however, it is desired to be able to selectively attenuate the voltage reference, then the arrangement shown in FIG. 5 is more suitable. Here a further capacitor 80 is interposed between the switch 72 and the sampling capacitor 70. A shorting switch 82 is provided in parallel with the further capacitor 80. A grounding switch 84 is also provided so as to selectively connect one plate of the capacitor 80 to ground, as shown in FIG. 5. In use, the grounding switch 84 is opened (made high impedance), the voltage reference generator 22 is switched on, and then switches 72 and 82 are closed (low impedance) such that the reference voltage is sampled on to the sampling capacitor 70. Once this has been achieved, the sampling switch 72 is made high impedance and the voltage reference generator 22 can be de-powered, as before. The switch 82 is now placed in a high impedance state. Thus, switches 82 and 84 are now open, and consequently the voltage presented by the sampling capacitor to the comparator 20 still remains equal to the reference voltage. However, when switch 84 is closed (i.e. placed in a low impedance state) then the further capacitor 80 is placed in parallel with the sampling capacitor 70. As a consequence charge redistribution occurs between the sampling capacitor and the further capacitor 80 such that both capacitors have the same voltage difference across them (which they must) resulting in the voltage being presented to the comparator becoming attenuated. Other switching schemes are possible.

The sampling capacitor 70 and the further capacitor 80 may have fixed relative sizes such that a predetermined attenuation is applied. Alternatively either one, or preferably both of them may be made as variable capacitors such that a range of attenuations can be provided. It is known to the person skilled in the art of semiconductor fabrication that variable capacitors can be fabricated by providing a plurality of smaller capacitors (often referred to as having a unit size or multiples of said unit size) in conjunction with respective series electrically controlled switches such that the capacitors can be selectively joined together in parallel to fabricate a variable capacitor whose capacitance is set by a digital control word controlling the respective series switches.

Figure 6:
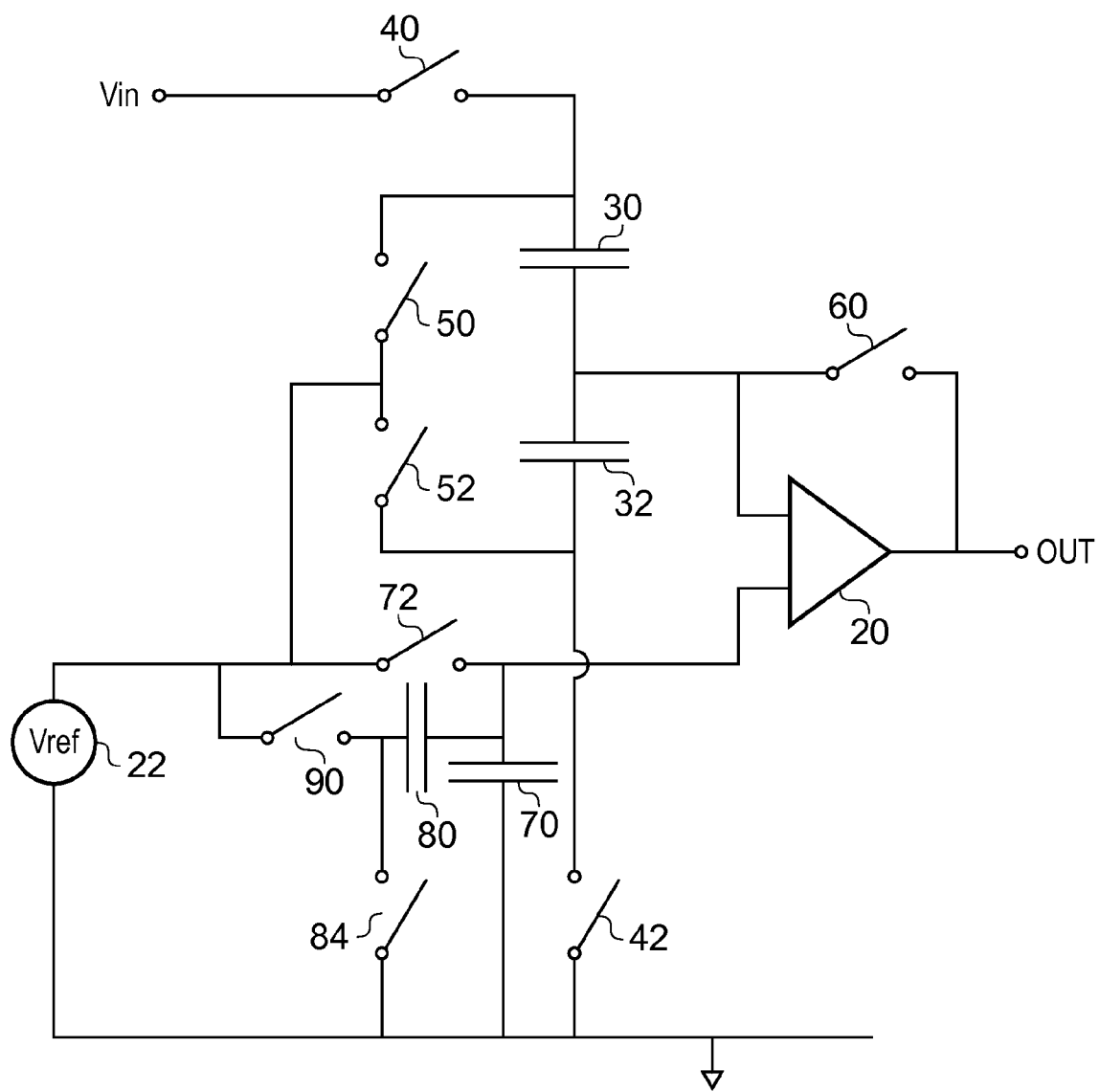
FIG. 6 shows a further embodiment in which the capacitor based potential divider and the sample and hold circuit for the reference voltage are implemented in a voltage monitor constituting a further embodiment of the present invention.

FIG. 6 schematically illustrates a circuit for a voltage monitor constituting an embodiment of the present invention and incorporating both the capacitive potential divider in respect of the input voltage and a voltage reference sampling and scaling circuit. Like reference numerals have been used to refer to parts hereinbefore described with respect to other ones of the Figures. It can be seen that the capacitive potential divider uses the components hereinbefore described with respect to FIG. 3. The sampling circuit for the voltage reference is similar to that described with respect to FIG. 5, except that the further capacitor 80 and the grounding switch 84 have been moved slightly such that the shorting switch 82 is no longer required to short out the further capacitor 80 but an additional sampling switch 90 has been provided in series with the additional capacitor 80. It can be seen that, during the sample and hold phase, switches 72 and 90 are closed together such that the switch 72 allows the reference voltage to be sampled on to the sampling capacitor 70 and switches 72 and 90 act together to provide a short circuit around the additional capacitor 80, thereby discharging it. Thus, once again, once the switches 72 and 90 are placed in a high impedance state, switch 84 may then be placed in a low impedance state causing charge redistribution to occur between the capacitors 70 and 80.

An advantage of having all of the capacitors as being variable is that it makes it easier to control and adjust the switching or trip threshold of the comparator. Thus the input capacitors 30 and 32 may be used to do a relatively crude voltage division, and the reference capacitors can make a find adjustment to the reference voltage presented to the comparator to accurately set the value Vin which causes the comparator to switch. The capacitors may be formed from multiple fixed size capacitors that can be selectively connected together to make up the respective capacitors 30 and 32 of the input capacitor array and 70 and 80 of the reference array.

It is advantageous, though not necessary, for the sum of the first and second capacitors 30 and 32 to equal the sum of the sampling and further capacitor 70 and 80, respectively such that any charge lost to or gained from parasitic capacitors equalises out at the decision threshold of the comparator 20 where the voltages at its inputs are substantially identical. Furthermore, if the input stage of the comparator exhibits non-negligible input currents, then providing these currents are substantially equal between the inverting and non-inverting inputs they will effect each of the capacitor pairs 30 and 32, and 70 and 80, substantially equally. In such an arrangement, each of the capacitors 30, 32, 70 and 80 needs to be individually adjustable such that the sums of the capacitances of each capacitor pair 30 and 32, and 70 and 80, can remain substantially equal to one another whilst the ratios of the first capacitor 30 to the second capacitor 32, and of the sampling capacitor 70, to the storage capacitor 80, can be freely adjusted. This allows the monitored voltage threshold where the comparator changes state to be easily adjusted.

As noted before, operating the switches can cause some charge injection to occur. If the charge injection can be estimated, the designer has the option to compensate for it by tweaking the relative sizes of the capacitor to provide a first order compensation.

Figure 7:
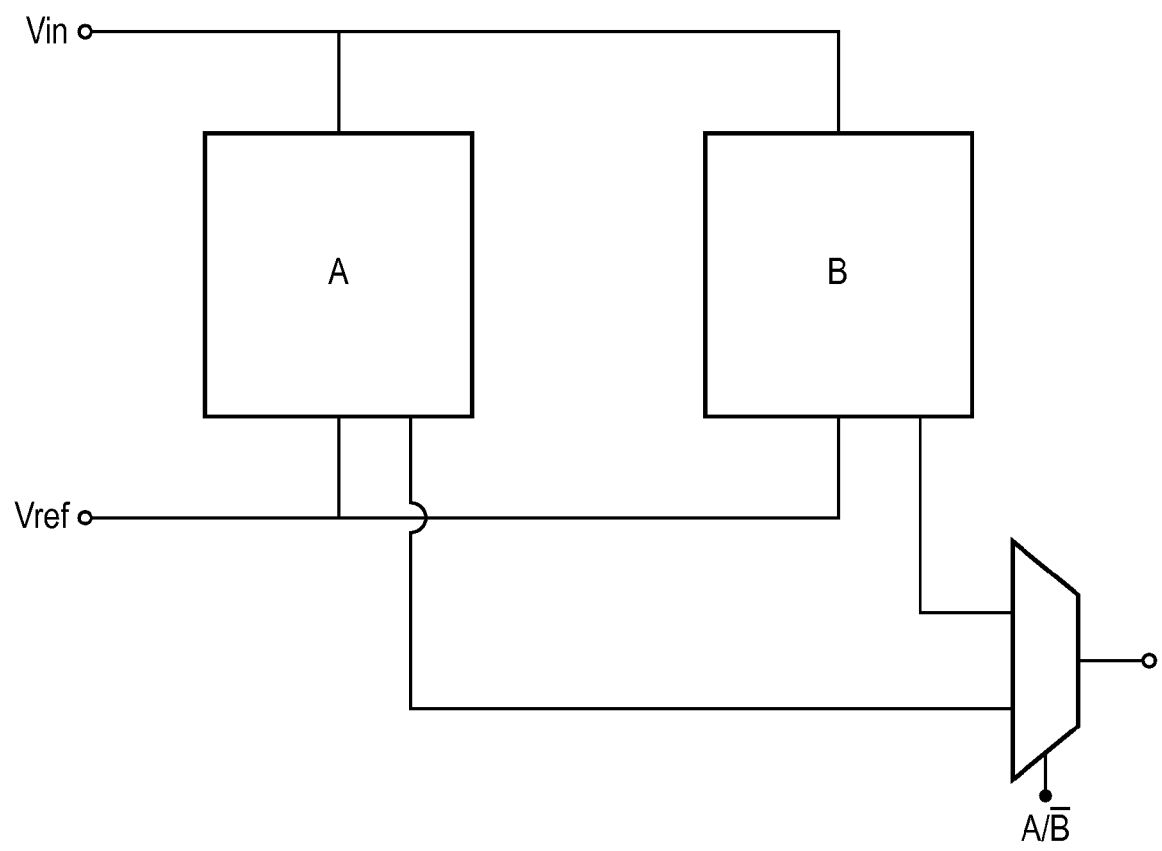
FIG. 7 is a schematic diagram showing a voltage monitor having two channels such that one channel can be monitoring an input voltage whilst the other one is being refreshed.
Figure 8A:
FIGS. 8a to 8c show timing diagrams for the circuit of FIG. 7.
Figure 8B:
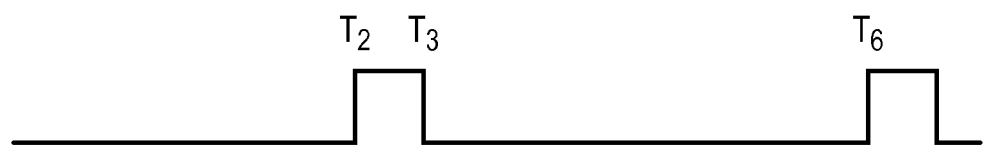
Figure 8C:
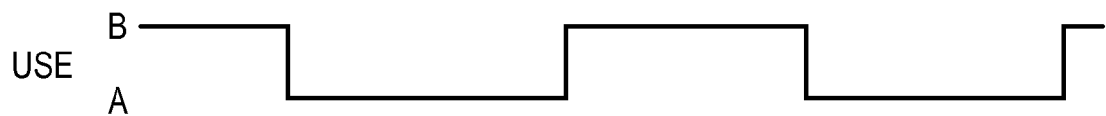

Trials of the circuit shown in FIG. 6 suggest that it can go for periods in excess of 10 milliseconds without exhibiting significant changes in its performance in regards to comparing the reference voltage and the input voltage. During this time, no current is drawn through the capacitive input stage, nor from the voltage reference generator 22. Thus the only part of the circuit that needs to be powered is the comparator 20. After the "on" period of 10 or more milliseconds, the circuit needs to be briefly refreshed by powering up the voltage reference generator 22 and operating the switches as described hereinbefore to reset the charges on the potential divider formed by the first and second capacitors 30 and 32, respectively, and to refresh the voltage held by the voltage reference sample and hold circuit. This typically takes 100 microseconds or less. If a 100 microsecond dead time is acceptable, then only one monitoring circuit need be provided. If, however, continuous monitoring is required then the circuit shown in FIG. 6 can be reproduced such that the voltage monitor effectively has two channels, channel A and channel B as shown in FIG. 7. The outputs of the channels could be "OR"ed together, or for greater certainty a multiplexer 95 may be used to select the channel that is active. The channels may be driven in anti-phase such that one is monitoring while the other is being refreshed. FIG. 8a shows a timeline representing the state of channel A. At time T0 channel A is refreshed, said refresh extending from time T0 to T1 and taking, in this example, around about 100 microseconds. During this time channel B is assumed to be available for monitoring, as shown in FIG. 8c. After time T1, both channels A and B are operative, but as channel A has been refreshed most recently, then it is assumed to be marginally more accurate. Channel A is not scheduled to be refreshed until time T4. Because, in this example, each channel is assumed to be "good" for at least 100 milliseconds, then time T4 is scheduled to occur roughly 200 milliseconds after time T1. Meanwhile channel B is scheduled to commence its refresh at time T2, approximately 100 milliseconds after time T1. After the channel B refresh event has completed at T3, channel B is now the "best" channel to use, and consequently the monitoring function is switched from channel A to channel B, as shown in FIG. 8c, and channel B continues to be monitored until such time as channel A has refreshed, and then channel A is monitored from time T5 onwards until the next scheduled refresh of channel B. Once a channel is no longer in use, then its comparator can be de-powered saving further current draw. Thus, for most of the time, only one of the comparators in either channel A and channel B are powered, with the exception that both are powered during the period when one channel is being monitored and the other is being refreshed in order that the comparator offset can be sampled onto the capacitive divider formed by the first and second capacitors 30 and 32. Thus, in the example of FIG. 6 in conjunction with FIG. 8, it can be seen that the voltage reference is only run for about 1% of the time compared to that shown in FIG. 9, the current through the potential divider is effectively zero compared to that taken by the resistive potential divider, save that a small current is drawn when charging of the first and second capacitors, and although two comparators are provided, effectively each is off for approximately half of the time so as the current drawn by the comparator remains unchanged (in fact it is only increased by between 1% and 2% compared to the prior art arrangement of having the comparator on all of the time). The outputs of the channels maybe combined by combinational logic to provide a single output or provided to a multiplexer.

It is thus possible to provide a voltage monitoring circuit in which the total current draw is considerably reduced compared to the prior art circuit shown in FIG. 9.

The claims have been presented in single dependency format suitable for presentation to the United States Patent Office. However, where multiple dependencies are allowed it is to be assumed that each claim may depend upon any preceding claim where those claims share a common independent claim, or the features of those claims can be combined in any combination unless such a combination is not technically feasible.

The invention claimed is:

1. A voltage monitor comprising:
a voltage reference circuit configured to be controllably de-powered and re-powered;
a sampling circuit coupled to the voltage reference circuit, the sampling circuit configured to:
sample a voltage provided by the voltage reference circuit when the voltage reference circuit is powered; and
hold a representation of the sampled voltage when the voltage reference circuit is de-powered;
a first capacitive circuit configured to provide a representation of an input voltage; and
a comparator circuit having first and second inputs, the first input of the comparator circuit coupled to the sampling circuit to receive the representation of the sampled voltage of the voltage reference and the second input of the comparator circuit coupled to the first capacitive circuit to receive the representation of the input voltage;
a switching circuit configured to sample an offset voltage at an output of the comparator circuit onto at least one capacitor included in the first capacitive circuit;
wherein the comparator circuit is configured to provide an output signal indicative of a comparison between the first and second inputs at least when the voltage reference circuit is de-powered;
wherein the output signal includes offset compensation provided using the sampled offset voltage; and
wherein the voltage reference circuit is configured to be re-powered in coordination with the sampling circuit for a stabilization duration before the sampling circuit samples the voltage provided by the voltage reference.

2. The voltage monitor as claimed in claim 1, further comprising electrically controlled devices for setting at least one capacitor included in the capacitive circuit to a predetermined state.

3. The voltage monitor as claimed in claim 2, in which the electrically controlled devices comprise transistors.

4. The voltage monitor as claimed in claim 2, further comprising a switching arrangement for selectively discharging at least one capacitor included in the capacitive circuit.

5. The voltage monitor as claimed in claim 1, wherein the sampling circuit comprises a second capacitive circuit, the second capacitive circuit configured to provide the representation of the voltage reference.

6. The voltage monitor as claimed in claim 5, wherein the second capacitive circuit comprises a capacitive divider circuit; and
wherein the representation of the voltage reference further comprises an attenuated representation of the voltage provided by the voltage reference, the attenuated representation established using a relationship between capacitances provided by at least two capacitors included in the second capacitive circuit.

7. The voltage monitor as claimed in claim 6, wherein the second capacitive divider circuit includes at least one variable capacitor; and
wherein the attenuated representation of the reference voltage is provided using an adjustable attenuation factor established using the at least one variable capacitor of the second capacitive divider circuit.

8. The voltage monitor as claimed in claim 5, wherein the sampling circuit further comprises a switching arrangement for selectively discharging the at least two capacitors of the second capacitive circuit.

9. The voltage monitor as claimed in claim 5, in which at least one of the first capacitive circuit or the second capacitive circuit includes a variable capacitor.

10. The voltage monitor as claimed in claim 5, wherein a controller is configured to adjust a capacitance of a variable capacitor included in the first capacitive circuit or the second capacitive circuit such that the sum of a capacitance of the first capacitive circuit is equal to the sum of a capacitance-of the second capacitive circuit.

11. The monitor as claimed in claim 1, in which the first capacitive circuit includes a variable capacitor.

12. The voltage monitor as claimed in claim 1, wherein the first capacitive circuit further comprises a first capacitive divider circuit; and wherein the representation of the input voltage further comprises an attenuated representation of the input voltage established using a relationship between capacitances provided by at least two capacitors included in the first capacitive divider circuit.

13. The voltage monitor as claimed in claim 12, wherein the first capacitive divider circuit includes at least one variable capacitor; and wherein the attenuated representation of the input voltage is provided using an adjustable attenuation factor established using the at least one variable capacitor of the first capacitive divider circuit.

14. A voltage monitor comprising:
a voltage reference circuit configured to be controllably de-powered and re-powered;
a first channel comprising:
a sampling circuit coupled to the voltage reference circuit, the sampling circuit configured to:
sample a voltage provided by the voltage reference circuit when the voltage reference circuit is powered; and
hold a representation of the sampled voltage when the voltage reference circuit is de-powered;
a first capacitive circuit configured to provide a representation of an input voltage; and
a first comparator circuit having first and second inputs, the first input of the comparator circuit coupled to the sampling circuit to receive the representation of the sampled voltage of the voltage reference and the second input of the first comparator circuit coupled to the first capacitive circuit to receive the representation of the input voltage;
a first switching circuit configured to sample an offset voltage at an output of the first comparator circuit onto at least one capacitor included in the first capacitive circuit;

wherein the first comparator circuit is configured to provide an output signal indicative of a comparison between the first and second inputs at least when the voltage reference circuit is de-powered;
wherein the output signal provided by the first comparator includes offset compensation provided using the sampled offset voltage;
wherein the voltage reference circuit is configured to be re-powered in coordination with the sampling circuit for a stabilization duration before the sampling circuit samples the voltage provided by the voltage reference;
wherein the voltage monitor includes a second channel including a second comparator; and
wherein the second channel including the second comparator is configured to provide the output signal when the first channel is being refreshed.

15. The voltage monitor as claimed in claim 14, wherein the first channel is configured to be coupled to the voltage reference when the first channel is being refreshed; and wherein the second channel is decoupled from the voltage reference when the first channel is being refreshed.

16. The voltage monitor as claimed in claim 14, wherein the first capacitive circuit further comprises a first capacitive divider circuit; and wherein the representation of the input voltage further comprises an attenuated representation of the input voltage established using a relationship between capacitances provided by at least two capacitors included in the first capacitive divider circuit.

17. The voltage monitor as claimed in claim 16, wherein the first capacitive divider circuit includes at least one variable capacitor; and wherein the attenuated representation of the input voltage is provided using an adjustable attenuation factor established using the at least one variable capacitor of the first capacitive divider circuit.

18. The voltage monitor as claimed in claim 14, wherein the first comparator circuit is configured to be de-powered when the second comparator of the second channel is selected to provide the output signal, except when the first channel is being refreshed.

19. The voltage monitor as claimed in claim 14, wherein the first comparator circuit is configured to remain powered at least during a refresh of the first channel, when the second comparator of the second channel is selected to provide the output signal.

* * * * *